(12) United States Patent
Törnqvist et al.

(10) Patent No.: US 7,535,094 B2
(45) Date of Patent: May 19, 2009

(54) SUBSTRATE STRUCTURE, A METHOD AND AN ARRANGEMENT FOR PRODUCING SUCH SUBSTRATE STRUCTURE

(75) Inventors: Håkan Törnqvist, Göteborg (SE); Sophia Johansson, Göteborg (SE); Malin Sjöberg, Mölnlycke (SE); Klas Axelsson, Askim (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 412 days.

(21) Appl. No.: 11/225,851

(22) Filed: Sep. 14, 2005

(65) Prior Publication Data

US 2006/0054351 A1 Mar. 16, 2006

Related U.S. Application Data

(63) Continuation of application No. PCT/SE03/00423, filed on Mar. 14, 2003.

(51) Int. Cl.
*H01L 23/12* (2006.01)
(52) U.S. Cl. ............... 257/700; 257/685; 257/698; 257/728; 257/773; 257/774; 257/776; 257/783; 257/E23.003; 257/E23.009; 257/E23.011
(58) Field of Classification Search ........... 257/668, 257/678, 685, 686, 700, 723, 777, 728, 730, 257/753, 773–776, 783, E27.111, E27.137, 257/E27.144, E27.161, E25.006, E25.013, 257/E25.018, E25.03, E23.001–E23.194
See application file for complete search history.

(56) References Cited

U.S. PATENT DOCUMENTS

| | | | | |
|---|---|---|---|---|
| 5,371,404 A | * | 12/1994 | Juskey et al. | 257/659 |
| 5,637,834 A | | 6/1997 | La Bate, Jr. et al. | |
| 5,641,996 A | * | 6/1997 | Omoya et al. | 257/787 |
| 5,853,622 A | | 12/1998 | Gallagher et al. | |
| 6,069,407 A | * | 5/2000 | Hamzehdoost | 257/774 |
| 6,294,407 B1 | | 9/2001 | Jacobs | |
| 7,081,675 B2 | * | 7/2006 | Yim et al. | 257/753 |

* cited by examiner

*Primary Examiner*—Jasmine J Clark
(74) *Attorney, Agent, or Firm*—Nixon & Vanderhye, P.C.

(57) ABSTRACT

The present invention relates to a substrate structure comprising at least two substrate layers extending in substantially parallel planes, which substrate layers are (Z-)interconnected in a direction substantially perpendicular to said planes. It comprises at least one adhesive film layer for interconnecting said at least two substrate layers, said adhesive film layer(s) comprising non-conductive portions and conductive portions. The position(s) of conductive portions is controllable such as to admit positioning of conductive portions at locations in the substrate layers where electrical conductivity is needed in a direction substantially perpendicular to the planar extension of, and between, two interconnected substrate layers.

24 Claims, 6 Drawing Sheets

SUBSTRATE STRUCTURE, A METHOD AND AN ARRANGEMENT FOR PRODUCING SUCH SUBSTRATE STRUCTURE

CROSS REFERENCE TO RELATED APPLICATION

This application is a continuation of International Application No. PCT/SE2003/000423 filed Mar. 14, 2003, the entire content of which is hereby incorporated by reference.

FIELD OF THE INVENTION

The present technology relates to a substrate structure comprising at least two interconnected substrate layers, particularly two interconnected substrates each e.g. being a multilayer substrate. The technology also relates to a method of interconnecting at least two substrate layers and to an arrangement for carrying out said method. Particularly it relates to Multi-Chip Modules (MCM) with large substrates which are electrically Z-interconnected in a direction substantially perpendicular to the planes in which the substrate layers extend.

RELATED ART AND OTHER CONSIDERATIONS

It is known to interconnect several substrate layers and to provide for electrical contact in a direction substantially perpendicular to the substrate structure plane, so called Z-interconnection. (In this application the concept a substrate layer comprises a substrate, which in turn may comprise one or more layers, also called sub-layers.) Some known solutions are based on soldering for providing interconnection. This is disadvantageous in so far that if several substrate layers are to be interconnected, this is to be done in one single step. Furthermore, gaps are formed between substrates which somehow have to be filled out. Another disadvantage consists in that melting of solder bumps creates a flux residue as a by-product (which under particular circumstances may act as an electrolyte) which has to be removed and thus some kind of cleaning step is required. In addition thereto, the gaps formed between the substrates have to be filled in order to protect chips and pads against a detrimental external environment. It is also difficult to provide for electrical shielding of different functionalities. Still another drawback consists in the fact that quite high temperatures are required for the soldering step, which may reduce the endurance and life time of a chip. Furthermore it is not possible to use contacts which are pre-mounted on to the substrate (pre-soldered). Still another drawback of using soldering is that the high soldering temperatures that are required make it difficult to interconnect materials with different operation temperatures, i.e. to thermally match different materials.

In order to provide for Z-interconnection it is also known to use wire bonding through holes in an upper substrate to a lower substrate, which however is disadvantageous and makes the routing of signals complicated. In addition thereto it is not known to Z-interconnect large size substrates through the hitherto known methods.

A selectively electrical conductive adhesive film is known, herein called ABC (Area Bonding Conductive) film. It is for example known to use such an adhesive film for contacting of Ball Grid Arrays (BGA) and polyimid cables with Cu conductors.

Such films are for example disclosed in U.S. Pat. No. 5,571,593 which relates to a circuit carrier on which solder joints can be made directly to via and through holes without solder being wicked into the vias or through holes. This is achieved through filling plated through holes with an epoxy or cyanate fill composition. When cured and overplated, the fill composition provides support for the solder joint and provides a flat solderable surface for the interconnection. The cured fill compositions may be conductive.

U.S. Pat. No. 5,074,947 relates to a method for interconnecting bond pads of a flip chip with bond pads of a substrate by an electrically conductive polymer. However, none of the documents, or the general state of the art, provides a remedy to the disadvantages and drawbacks referred to above.

BREIF SUMMARY

What is needed is therefore a substrate structure which comprises at least two substrate layers (e.g. at least two multilayer substrates) and in which Z-interconnection is provided, which further is easy to fabricate. Further a substrate structure is needed through which three dimensional microwave (or millimeter wave) Multi-Chip Module structures can be provided. Furthermore a substrate structure is needed which has a high reproducibility and which can be produced with a limited number of process steps as compared to hitherto known substrate structures manufacturing processes.

A substrate structure is also needed through which different functionalities can be well electrically shielded in an easy manner and which admits the use of premounted (soldered) contacts, and through which (any kind of) electrical contact (for signal or voltage feeding) can be provided between different substrate (layers) e.g. for DC, RF connections e.g. by means of coaxial cables, etc. Still further a substrate structure is needed which has a high functional reliability and which is cheap and easy to produce and which is less exposed to external, or environmental impact. In addition thereto a substrate structure is needed through which large substrate layers can be electrically Z-interconnected. Moreover a substrate structure is needed through which a good radio frequency performance can be achieved for electrical, e.g. coaxial connections. A substrate structure is also needed which comprises substrate layers with several circuits and electrical components and through which the routing of signals is facilitated as compared to in hitherto known substrate structures.

The technology also provides a method for providing a substrate structure as referred to above, according to which one or more of the above mentioned objects can be achieved. Particularly provided is a method through which large substrate layers can be interconnected without this resulting in large air encapsulations that may prevent or disturb Z-interconnection and deteriorate the required cooling. Particularly provided is a substrate structure, a method for producing such a structure and an arrangement for carrying out said method through which a substrate design can be provided without requiring any through wire bonding holes and through which facilitated signal routing is obtained.

Therefore, a substrate structure which comprises at least two substrate layers extending in substantially parallel planes is provided, which substrate layers are interconnected in a direction substantially perpendicular to said planes (Z-interconnected). The substrate structure comprises at least one adhesive film layer for interconnecting said at least two substrate layers. The adhesive film layer (or layers) comprise non-conductive portions and conductive portions. The locations of conductive portions is controllable such as to admit positioning of conductive portions at locations in the substrate layers where electrical connectivity or conductivity is needed in a direction substantially perpendicular to the planar extension of two interconnected substrate layers. The conductive portions of the adhesive film advantageously comprise conductive particles, e.g. of Ag, Au, Cu or a material with similar properties.

Particularly the adhesive film may comprise a conductive powder as described in U.S. Pat. No. 5,571,593, which herewith is incorporated herein by reference. Mostly an appropriate metal powder is used.

The adhesive film particularly comprises a polymer, an epoxy composition or a cyanate composition. Particularly the entire adhesive film comprises such a material with conductive particles, or conductive powder, added at the conductive portions (or added to a larger extent at the conductive portions). In a particular implementation the adhesive film layer comprises an Area Bonding Conductive film. The adhesive film layer is controllably and selectively conductive at the design stage, i.e. the locations of conducting portions are controllable or selectable at the design stage. Particularly conductive portions are provided at locations of the substrate layers where electrical, e.g. DC/RF, high frequency, contact is needed between adjacent substrate layers (i.e. particularly between substrates).

In advantageous embodiments the substrate structure comprises more than two substrate layers, a adhesive film layer being provided to interconnect each pair of adjacent substrate layers, thus allowing electrically conductive connection (Z-interconnection) between substrate layers at selected locations. In a particularly advantageous implementation the substrate structure comprises or is used to build a microwave (or millimeter wave) Multi-Chip Module (MCM).

In a particular implementation adjacent substrate layers are interconnected successively, e.g. in any order, which means that not all layers (substrates of the substrate structure) have to be interconnected in one and the same step, but successive or consecutive interconnection is enabled. This means that testing and verification is enabled between interconnection of the respective substrates/layers. Particularly the substrate layers comprise ceramic or organic materials provided with recesses, holes or cavities for housing electrical components/IC boards. Particularly the substrate structure comprises a TILE Multi-Chip Module.

With a TILE chip module it is (here) meant a module wherein the components are built on several boards which are disposed in parallel with e.g. the antenna surface, on each other in Z-direction as opposed to a Brick module for which the components of the module are built on one (or more) boards which extend perpendicularly to e.g. the antenna surface.

In a most advantageous implementation the substrate layers are provided with through vent holes (vias), at least in areas requiring electrical contact (Z-interconnection) between substrate layers. The purpose thereof is to allow encapsulated air to escape, in other words, during interconnection air is allowed to escape. Such through holes or vias may be provided more less throughout the substrate layers, but it is particularly important that they are provided in the areas requiring electrical contact. The hole/via density may also be higher in such areas than elsewhere, or alternatively such holes are only provided in such areas. The diameter of such a through vent hole (via) may be about 200 µm. This figure is of course merely given for exemplifying reasons.

Moreover, in an advantageous implementation the substrate layers are somewhat flexible so as to allow for one substrate layer to adapt to another in case of unevenness, and it may comprise an organic, ceramic material, teflon, LCP (Liquid Crystalline Polymer) or a material with similar properties. Comparatively large substrates may be interconnected, e.g. substrates having an area up to 100×100 mm² or more. Of course also smaller substrate layers may be interconnected. They may also have any appropriate shape, i.e. they need not to be square shaped but they may also be rectangular, circular etc.

A method is provided for interconnecting at least two substrate layers, while allowing electrical contact between said substrate layers in a direction substantially perpendicular to the substrate layer plane extension (Z-interconnection), is disclosed. The method comprises the steps of: establishing where on a substrate layer electrical contact is to be provided to the adjacent substrate layer; providing a selectively conducting adhesive film with conductive portions and non-conductive portions on said substrate layer such that the conductive portions will be disposed where electrical contact is to be provided; joining said at least two substrate layers. Particularly the method further includes the steps of; repeating the steps disclosed above for adding a further substrate layer to the substrate structure comprising at least two interconnected layers. This may be done in one operation or in successive operations allowing verification and testing inbetween interconnection of a further layer (substrate). This means that each interconnection operation of a substrate (layer) to another may be performed in a separate step, several interconnections thus occurring consecutively.

The method particularly comprises the step of; providing electrically conducting, e.g. DC/RF, interconnection between components in the respective substrate layers. In an advantageous implementation the method also comprises the step of, before interconnection itself, providing each substrate layer with through vent holes (vias) at least in those areas requiring electrically conducting interconnection in order to allow encapsulated air to escape. In a particular implementation the substrate layers are somewhat flexible and during compression in a lamination step, one substrate layer may substantially assume the shape of the adjacent substrate layer to which it is interconnected, or at least adapt to that shape to some extent.

The making of one substrate layer adapt to the shape of an adjacent substrate layer may be further assisted by the steps of; laminating the substrate layers by providing the substrate layers on a flexible, compressive (rubber) plate provided on a rigid plate, e.g. of steel, allowing exertion of the required pressure substantially homogeneously, while applying the appropriate heat (the temperature of which as referred to above being lower than the temperature required for soldering).

The adhesive film layer or layers particularly comprise Area Bonding Conductive films with conductive particles, e.g. a conductive powder, at the conductive portions, or a higher concentration of such particles in those areas. Particularly the method is used to produce microwave Multi-Chip Modules (or millimeter wave modules).

Particularly the substrate layers comprise large area substrates, which e.g. may have a size of up to 100×100 mm² or more, of any shape. They may also be even larger than that, but of course also smaller. Particularly the conductive portions of the adhesive or adhesive film comprise or include conductive particles, e.g. a carbon powder or a metal powder, most preferably of Ag. According to different embodiments a adhesive film comprises one homogeneous film with different concentration of conductive particles depending on whether a location or an area is to be conductive or non-conductive, or alternatively it may comprise different adhesive films separately provided on a substrate layer, or alternatively, on a specific plate or similar for subsequent application to a substrate layer.

The technology also suggests an arrangement for carrying out the method as disclosed above, for providing a substrate structure as discussed above, which comprises a fixture with a flexible plate provided on a rigid plate, pressurizing means for exerting a pressure on the substrate layers disposed between the flexible plate and a further rigid plate, and heating means for heating in order to anneal or cure the adhesive film, and Z-interconnecting the substrate layers.

It is an advantage that substrate structures, particularly microwave MCM modules, may be produced at lower costs, in an easier manner and having a simpler design, which also operate in a reliable manner, have a long lifetime and which allow for a simple routing of signals, as well as components in the substrate structure are protected. It is also an advantage that larger substrates can be interconnected than it hitherto was possible.

BRIEF DESCRIPTION OF THE DRAWINGS

The invention will in the following be more thoroughly described, in a non-limiting manner, and with reference to the accompanying drawings in which.

DETAILED DESCRIPTION

Figure 1:
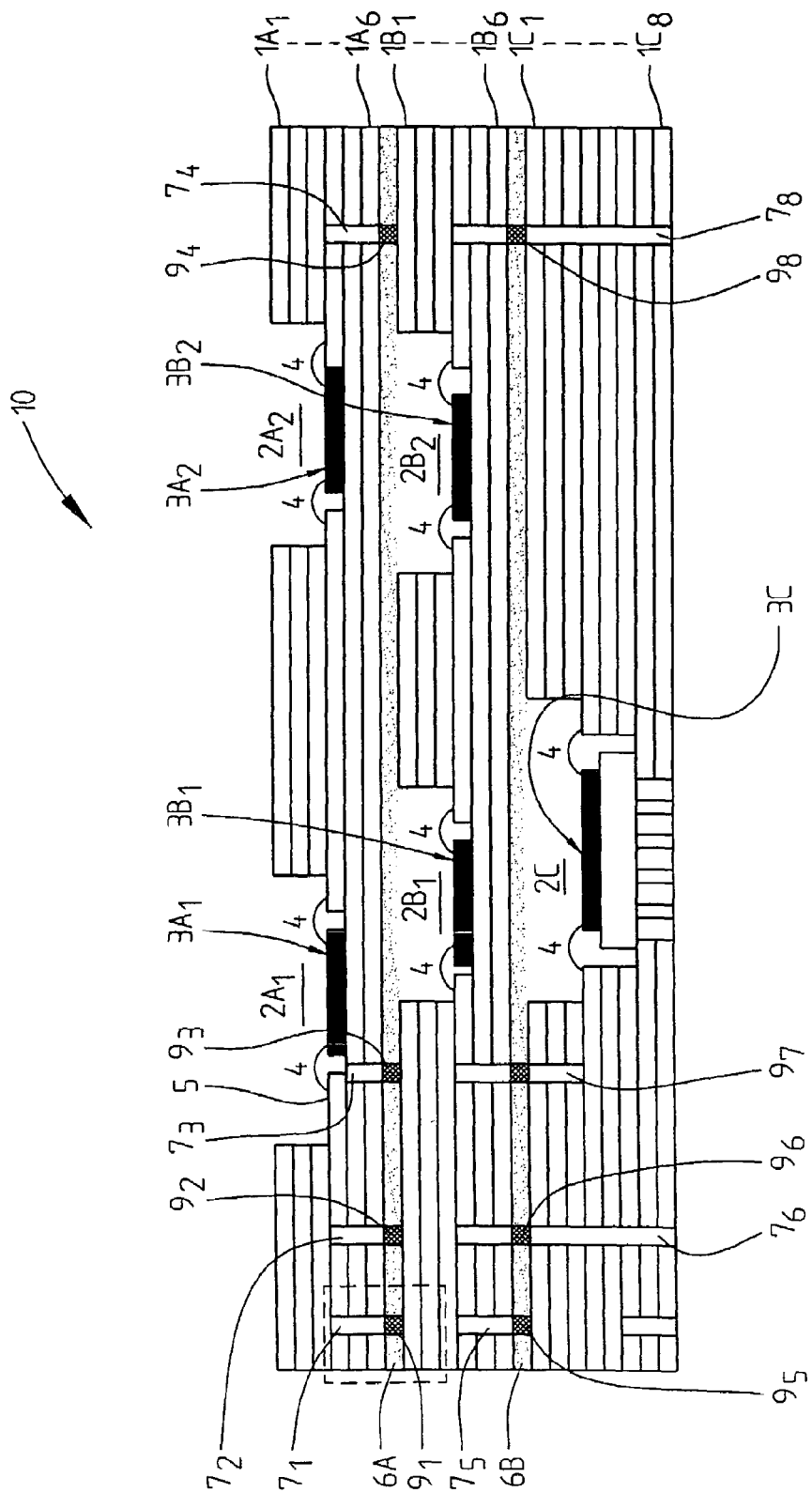
FIG. 1 shows an embodiment with three Z-interconnected substrate layers.

FIG. 1 shows a substrate structure 10 with three substrate layers 1A, 1B, 1C. Each substrate (layer) 1A, 1B, 1C in turn comprises a multilayer structure, with (here) sublayers $1A_1$-$1A_6$; $1B_1$-$1B_6$ and $1C_1$-$1C_8$ respectively.

The first substrate layer 1A comprises two cavities $2A_1$, $2A_2$ in each of which, at the bottom, an integrated circuit $3A_1$, $3A_2$ is provided. In a similar manner the intermediate substrate layer 1B comprises two cavities $2B_1$, $2B_2$ with integrated circuits $3B_1$, $3B_2$, whereas the third (here bottom) substrate layer comprises one cavity 2C with an integrated circuit 3C. The IC-circuits are connected (here) via bonding wires 4 to connections 5 (only one shown for reasons of clarity) in the respective substrate layer. The substrate layers 1A, 1B, 1C are interconnected by means of adhesive films 6A, 6B which are non-conductive with the exceptions of the locations where conductivity is desired, namely at inter-substrate layer connections (electrical vias) $7_1$-$7_8$. At these locations the adhesive film comprises conductive portions $9_1$-$9_8$.

Through the adhesive films 6A, 6B the substrate layers are mounted and held together mechanically. Although the denotation substrate layer is used in this application, it should be clear that it actually refers to substrates, particularly multilayer substrates. Z-connection is obtained through the conductive portions of the adhesive film. Particularly electrical interconnection is provided for DC-, and RF-connections but the concept applies to any electrical connection for signal or voltage feeding. In a particular implementation substrate layers 1A and 1B are interconnected in one step, whereas substrate layers 1B and 1C are interconnected in another step. Of course these steps may be performed simultaneously, but it is an advantage that the interconnections may be performed in separate steps, e.g. allowing for testing of the functionality of the substrate module between each step.

In a particular embodiment a so called ABC-film is used. Then a non-conductive adhesive film is screen-printed on to a surface in such a pattern that it is only provided in the areas where non-conductivity is desired. (Instead of screen-printing, stenciling may be used.) The adhesive film is then dried (B-staged). Subsequently a adhesive film (the conductive portions of the adhesive film) is screen-printed or equivalent on to those areas where conductivity is required. The adhesive film is then dried (B-staged). The conductive adhesive film particularly comprises the same material, e.g. a polymer, epoxy, polyimid etc., as the non-conductive adhesive film, but with conductive particles or conductive powder added to it, e.g. of Ag, Au etc.

The substrate layers 1A, 1B, 1C particularly comprise teflon, a ceramic material, any organic material or an LCP (Liquid Crystalline Polymer). Advantageously the substrates (substrate layers 1A, 1B, 1C) are somewhat flexible. The substrate layers 1A, 1B, 1C are even more particularly provided with through (vent) holes, vias, particularly in the regions where electrical contact is important. These through holes serve the purpose of enabling encapsulated air to escape.

Figure 2:
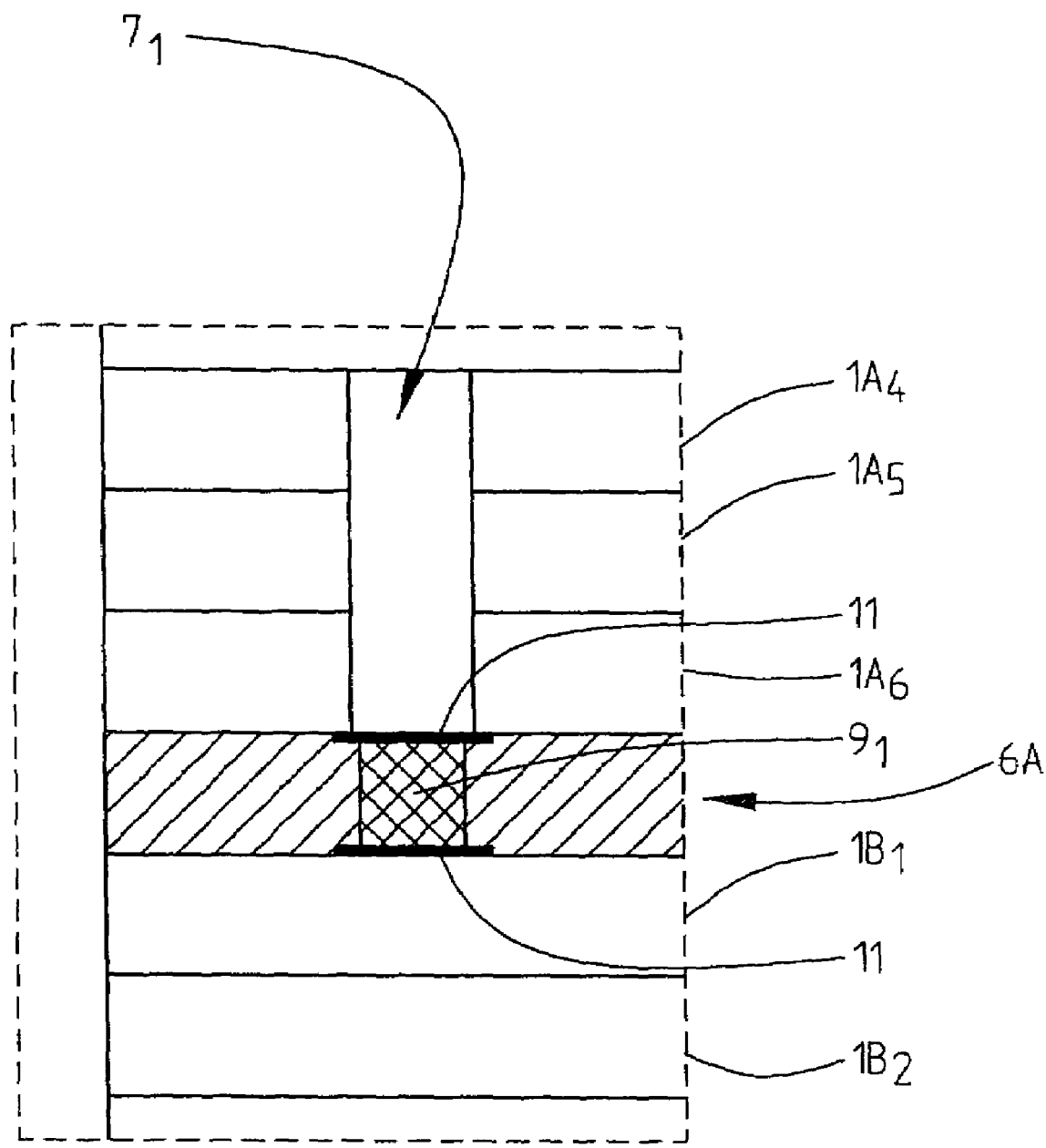
FIG. 2 is a sectional view of the part of FIG. 1 illustrated with dashed lines.

FIG. 2 is an enlarged view of the portion within the dashed lines of FIG. 1 illustrating inter-substrate layer electric connection $7_1$. Substrate layer sublayers $1A_4$, $1A_5$, $1A_6$ and $1B_1$, $1B_2$ are shown. The bottom end of sublayer $1A_6$ and the top of sublayer $1B_1$ are provided with contact pads 11, 11 at the locations requiring electric Z-interconnection. Between the contact pads 11, 11 (or at an area somewhat smaller than that of the contact pads) a conductive portion $9_1$ of the adhesive film 6A is provided, whereas where no electrical conductivity is needed, the non-conductive portion of the adhesive film 6A is provided.

Figures 3A, 3B, 3C:
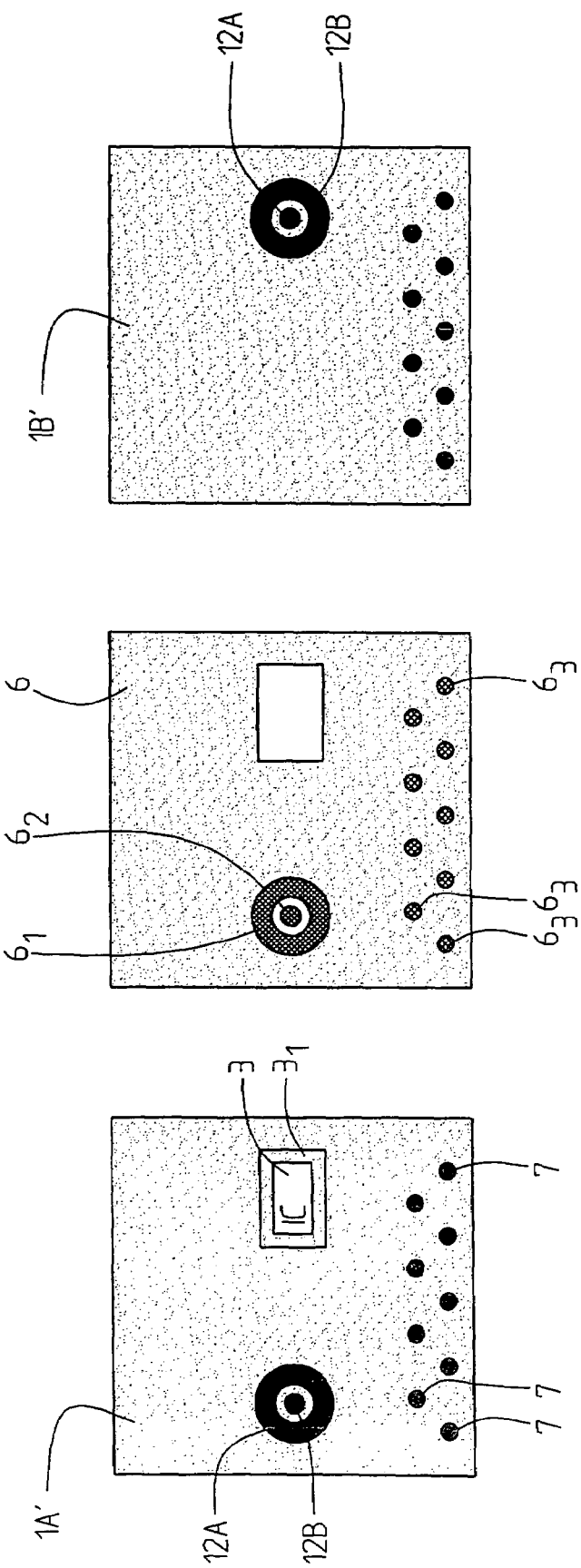
FIG. 3A is a top view of the upper substrate of a two (layer) substrate structure.
FIG. 3B is a top view of the adhesive film interconnecting the substrate (layer) of FIG. 3A with second substrate layer.
FIG. 3C is the lower substrate of the two layers substrate structure seen from below.

FIGS. 3A-3B illustrate a substrate structure comprising a first substrate (layer) 1A (FIG. 3A), a second substrate (layer) 1B' (FIG. 3C) and a adhesive film 6 interconnecting the substrate layers 1A' and 1B'.

FIG. 3A shows the upper surface of a substrate structure with a substrate layer 1A' at the top and with a number of DC-connections 7, . . . 7, (i.e. a conductive material), a coaxial cable connection with outer 12A, and inner, 12B, connectors (i.e. a conductive material). The substrate layer 1A' furthermore comprises a cavity $3_1$ (of substrate material) at the bottom of which an IC-circuit 3 is disposed.

FIG. 3B shows the interconnecting adhesive film 6 with conductive portions $6_1$, $6_2$, $6_3$ corresponding to the DC-connections and coaxial connection. Where the cavity with the IC-circuit is disposed in substrate layer 1A', there is no adhesive film at all.

FIG. 3C shows the bottom of the substrate structure with second substrate layer 1B' from below. DC-connections 7, . . . 7, coaxial cable connection with conducting potions 12A, 12B with non-conductive substrate layer material inbetween are shown in a manner similar to that in FIG. 3A.

Figure 4:
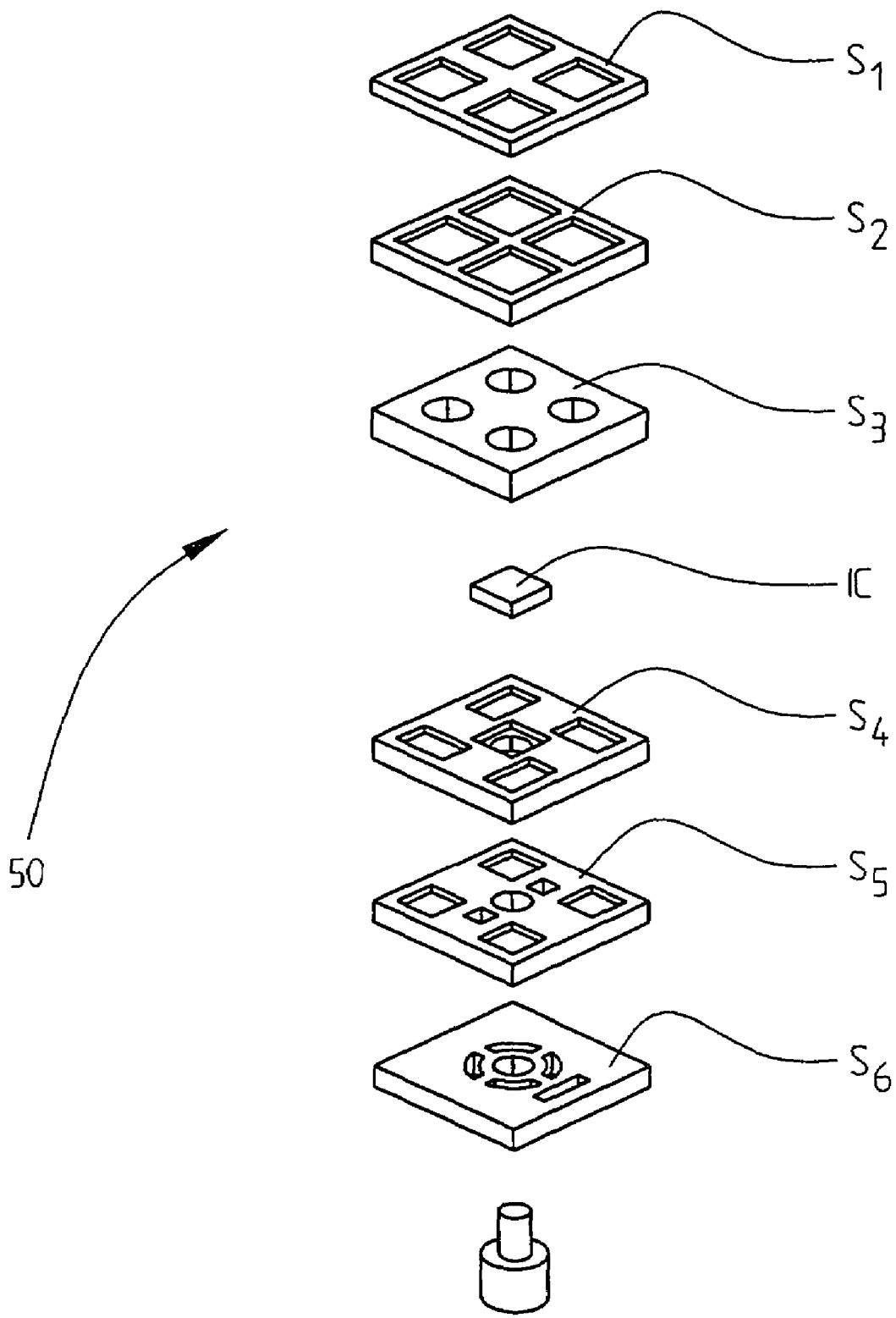
FIG. 4 shows a three dimensional microwave module, FIG. 5 schematically illustrates an arrangement for carrying out the method according to the invention.

FIG. 4 very schematically illustrates a three-dimensional microwave module, for the building of which the inventive concept may be implemented. The substrate structure 50 comprises a number of substrates (also denoted substrate layers) $S_1$-$S_6$. Between each consecutive substrate (layer) a selectively conductive adhesive film is provided as explained above. For reasons of clarity, however, the adhesive film layers are not illustrated in this figure, but it should be clear from the reading of the description of the previous embodiments and the corresponding figures how the inventive concept should be implemented.

Figure 5:
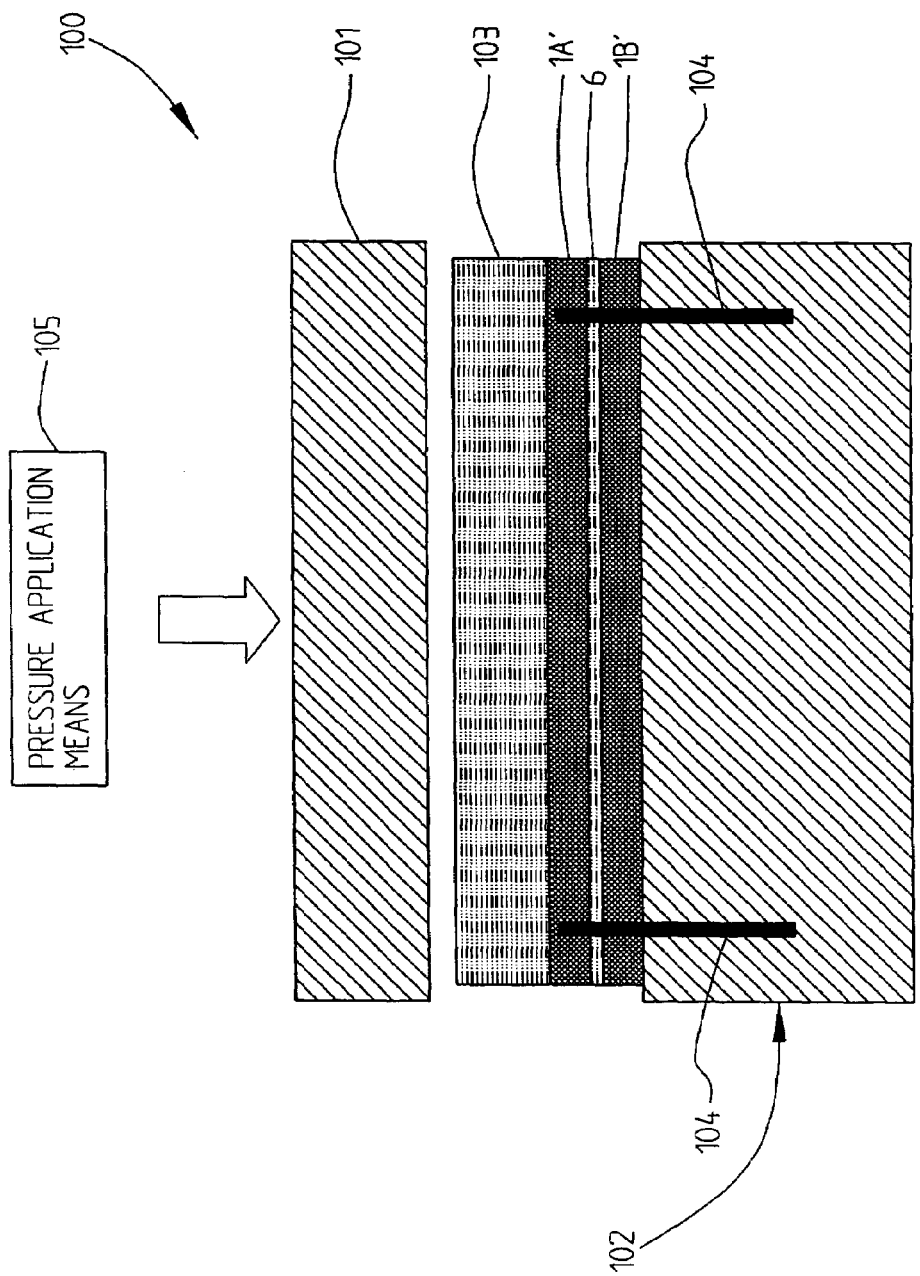

FIG. 5 very schematically illustrates an arrangement 100 for Z-interconnection of a number of substrate layers (here two substrates 1A', 1B' according to the inventive concept). It is here used for interconnecting substrate layers 1A', 1B' of a substrate structure having a size of approximately 100×100 mm$^2$. In one implementation the adhesive film 6 (with conductive and non-conductive portions) is screen-printed on one of the joining substrates. In an alternative implementation the adhesive film is screen-printed on a carrier layer, the adhesive film subsequently being transferred to one of the joining substrate layers. In order to allow for interconnection of large area substrates without air being encapsulated, which may prevent connection and affect (reduce) cooling, through vent holes or vias are distributed over the substrate layers in order to allow encapsulated air to escape. Such through vent holes may have a diameter of approximately 200 µm. This figure is of course only given for examplifying reasons. The density of through vent holes is particularly higher at areas where electrical contact is important. In one embodiment such through vent holes are only provided in areas requiring electrical contact. Alternatively the density of vent holes may be substantially the same throughout the substrate layer area. Another requirement is particularly that the substrate layers are somewhat flexible, thus allowing to take care of some unevenness. During compression in the lamination process the upper substrate layer may then, to some extent, assume the shape of the lower substrate layer (or vice versa), depending on interconnection arrangement and on how the interconnection procedure is carried out.

Finally the interconnection arrangement 100 preferably comprises a fixture which is able to provide a homogeneous pressure across the surface of the upper layer substrate (or the lower layer substrate). Therefore the fixture comprises an even, rigid plate 101, e.g. of steel, which may have a thickness of about 10 mm, which is covered by, or contacts, a flexible, compressible plate 103, e.g. of rubber, which e.g. may have a thickness of about 10 mm. It should be clear that the figures merely are given for exemplifying reasons.

The rigid, hard plate 101, gives support for the compressible/flexible plate which to some extent is able to adapt to a possible unevenness in the substrate.

FIG. 5 thus shows the interconnecting arrangement 100 with a fixture, comprising (steel) plate 101, compressive plate 103, planar rigid base plate 102, and the substrates 1A', 1B' with the interconnecting adhesive film 6. Guiding pins 104, 104 are used to assist in proper positioning of the substrate layers. In other aspects the arrangement functions in a conventional manner. Heating is e.g. achieved through placing the whole fixture in a furnace, or oven.

Figure 6:
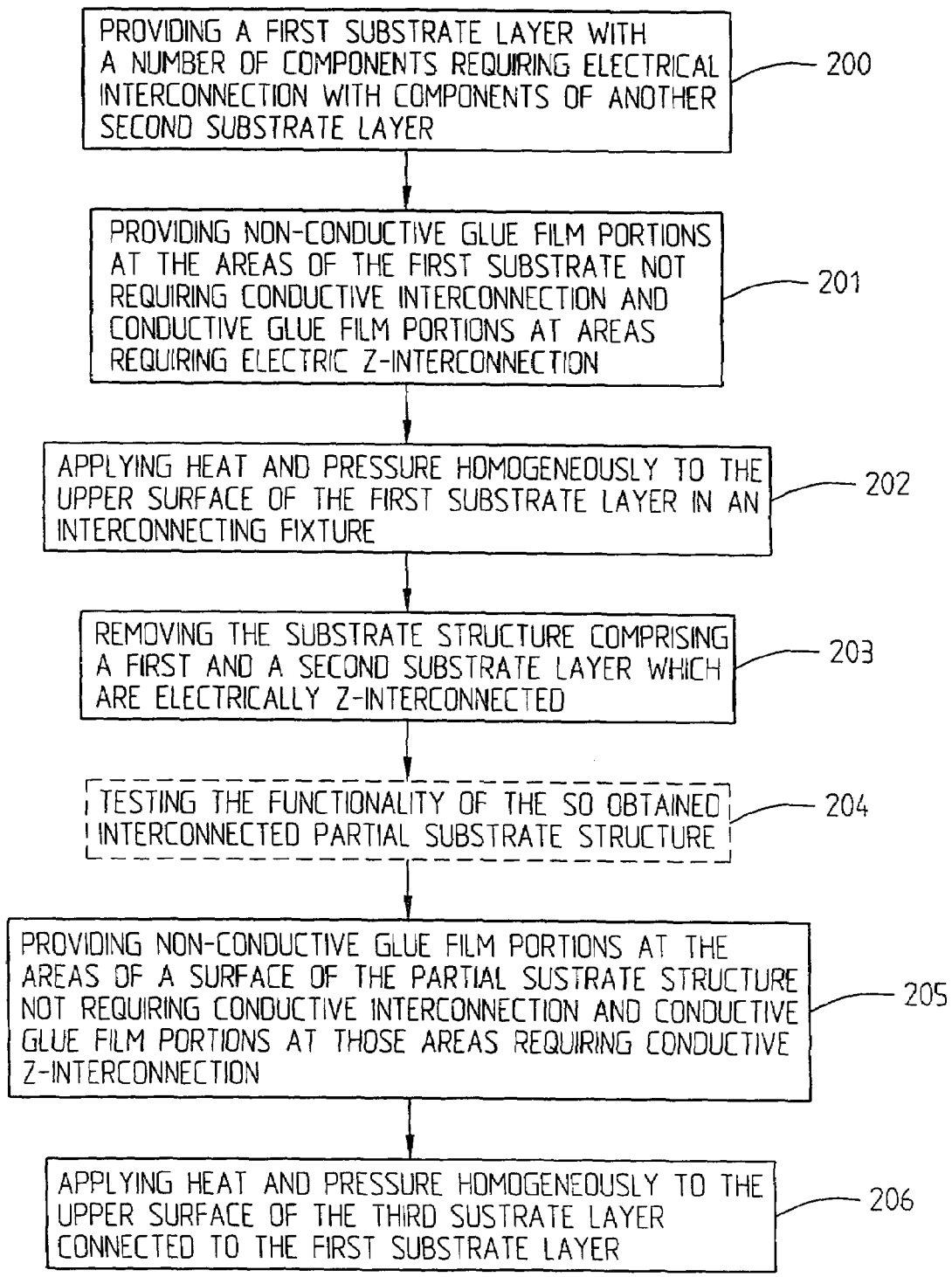
FIG. 6 is a flow diagram schematically illustrating one embodiment according to an example embodiment for providing Z-interconnection of substrate layers.

FIG. 6 is a flow diagram schematically illustrating interconnection of a three substrate layer structure according to one implementation of the inventive concept.

For the production of a MCM structure, here comprising three substrates (in this application also denoted substrate layers), it is supposed that a first substrate (layer) is provided, which in turn is a multilayer structure comprising a number of components requiring electrical interconnection with (components of) a second substrate layer, 200. Non-conductive adhesive film portions are provided at those areas of the first substrate which do not require conductive interconnection, whereas conductive adhesive film portions are provided at areas in locations requiring conductive interconnection, 201.

After locating the first and second substrates appropriately with respect to each other, with the adhesive film between them, heat and pressure is applied homogeneously to the upper surface of the first substrate in an interconnection fixture, 202. It should be clear that this can be done in other ways as well. In an advantageous implementation the so formed, partly finished, substrate structure is removed from the fixture, 203, and the functionality thereof may be tested, 204. This is an optional step and therefore indicated through dashed lines. It is however also not necessary to remove the partially finished structure, e.g. if no testing is wanted, therefore procedural step 203 is actually also optional. It may be proceeded directly with step 205, in which non-conductive adhesive film portions are provided at the areas of the relevant surface of the substrate structure not requiring conductive interconnection, and conductive adhesive film are provided portions at the areas requiring conductive interconnection. Again heat and pressure are applied homogeneously to the (upper) surface of the third substrate layer to be Z-interconnected to the partially finished structure (obtained in step 202), 206.

In an alternative implementation, all three layers are interconnected in the same step, i.e. the adhesive films are first provided in the desired manner, then the three substrates are interconnected.

It should be clear that the invention is not limited to the specifically illustrated embodiments, but it can be varied in a number of ways without departing from the scope of the appended claims. Different sizes and shapes of substrates can be used, different numbers of substrates can be interconnected, said substrates and consisting of any number of sublayers, different or the same, and the invention does not deal with how electrical leads are provided within a substrate (layer). Electrical connection within a layer can be provided for in any appropriate manner.

The invention claimed is:

1. A substrate structure comprising:
   at least two substrate layers extending in substantially parallel planes, which substrate layers are Z-interconnected in a direction substantially perpendicular to said planes,
   at least one adhesive film layer for interconnecting said at least two substrate layers, that said adhesive film layer(s) comprise(s) non-conductive portions and conductive portions, wherein position(s) of conductive portions is controllable such as to admit positioning of conductive portions at locations in the substrate layers where electrical conductivity is needed in a direction substantially perpendicular to a planar extension of, and between, two interconnected substrate layers, conductive portions being provided at locations to provide for electrical, e.g. DC/RF contact between adjacent substrate layers at said locations and
   wherein the substrate layers comprise through vent holes (vias) at least at areas requiring electrical conductive connection between substrate layers for allowing encapsulated air to escape, wherein the conductive adhesive film portions comprise conductive particles.

2. A substrate structure according to claim 1, wherein the conductive particles comprise Ag, Au, Cu or a material with similar properties.

3. A substrate structure according to 1, wherein the adhesive film comprises a polymer material, an epoxy or a cyanate film composition.

4. A substrate structure according to claim 1, wherein the adhesive film layer is selectively conductive at the design stage whereby the location(s) of conductive portions are controllable/selectable at the design stage.

5. A substrate structure according to claim 1, comprising more than two substrate layers, an adhesive film layer being provided to interconnect each pair of adjacent substrate layers, allowing electrically conductive connection between substrate layers at selected portions.

6. A substrate structure according to claim 5, further comprising a microwave Multi Chip Module (MCM).

7. A substrate structure according to claim 5, wherein substrate layers are interconnected consecutively in any order.

8. A substrate structure according to claim 1, wherein the substrate layers comprise ceramic or organic materials provided with recesses/cavities for electrical components/IC boards.

9. A substrate structure according to claim 1, wherein the structure comprises a TILE multi-chip module.

10. A substrate structure according to claim 1, wherein the diameter of a through vent hole (via) is about 200 μm.

11. A substrate structure according to claim 1, wherein the substrate layers are flexible so as to allow for one substrate layer to adapt to another in case of unevenness.

12. A substrate structure according to claim 1, further comprising large area substrate layers having an area up to 100× 100 $mm^2$ or more.

13. A substrate structure according to claim 11, wherein the substrate layers comprise an organic or ceramic material, teflon, LCP (Liquid Crystalline Polymer) or a material with similar properties.

14. A substrate structure comprising:
   at least two substrate layers extending in substantially parallel planes, which substrate layers are Z-interconnected in a direction substantially perendicular to said planes,
   at least one adhesive film layer for interconnecting said at least two substrate layers, that said adhesive film layer(s) comprise(s) non-conductive portions and conductive portions, wherein position(s) of conductive portions is controllable such as to admit positioning of conductive portions at locations in the substrate layers where electrical conductivity is needed in a direction substantially perpendicular to the planar extension of, and between, two interconnected substrate layers, conductive portions being provided at locations to provide for electrical, e.g. DC/RF contact between adjacent substrate layers at said locations and
   wherein the substrate layers comprise through vent holes (vias) at least at areas requiring electrical conductive connection between substrate layers for allowing encapsulated air to escape;
   wherein the adhesive film layer comprises an Area Bonding Conductive film.

15. A method for interconnecting at least two substrate layers while allowing electrical contact between the substrate layers in a direction substantially perpendicular to a substrate layer planar extension, of the method comprising:
   establishing where on a substrate layer an electrical contact is to be provided to the adjacent substrate layer,
   providing a selectively conducting adhesive film with conductive portions and non-conductive portions on the said substrate layer such that the conductive portions will be disposed where electrical contact is to be provided, and
   providing electrically conductive DC/RF connections between a plurality of multilayer substrate layers,
   joining said at least two substrate layers, and
   providing each substrate layer with through vent holes (vias) at least in the areas requiring electrically conductive interconnection in order to allow for escape of encapsulated air, wherein the conductive portions of the adhesive film comprise conductive particles.

16. A method according to claim 15, further comprising:
   adding a further layer to the substrate layer structure comprising at least two interconnected layers.

17. A method according to claim 16, wherein each interconnection of a substrate layer to another is performed in consecutive steps.

18. A method according to claim 15, wherein the substrate layers are somewhat flexible whereby during compression in a lamination step, a substrate layer substantially assumes the shape of the adjacent substrate layer.

19. A method according to claim 15, further comprising:
   laminating the substrate layers by providing the substrate layers on a flexible (rubber) plate provided on a rigid (steel) plate, thus
   exerting the required pressure homogeneously and applying the appropriate heat.

20. A method according to claim 15, further comprising using an Area Bonding Conductive film as adhesive film.

21. A method according to claim 15, further comprising producing microwave Multi Chip Modules.

22. A method according to claim 15, wherein the substrate layers comprise large multilayer substrate layers having a size up to 100×100 $mm^2$ or more, of any shape.

23. An arrangement for carrying out the method according to claim 15, comprising a fixture with a flexible plate provided on a first rigid plate cooperating with another rigid plate, pressuring means for exerting a pressure on the substrate layers provided between the rigid plate and the rubber plate provided on the first rigid plate and heating means for heating in order to anneal the adhesive film(s) and Z-interconnect the substrate layers.

24. A method according to claim 15, wherein the conductive portions of the adhesive film comprise conductive particles of Ag, Au.

* * * * *